United States Patent
Nakayama

(10) Patent No.: US 12,174,267 B2
(45) Date of Patent: Dec. 24, 2024

(54) EARTH LEAKAGE DETECTING DEVICE, AND VEHICULAR POWER SUPPLY SYSTEM

(71) Applicant: SANYO Electric Co., Ltd., Osaka (JP)

(72) Inventor: Masato Nakayama, Hyogo (JP)

(73) Assignee: SANYO Electric Co., Ltd., Osaka (JP)

( * ) Notice: Subject to any disclaimer, the term of this patent is extended or adjusted under 35 U.S.C. 154(b) by 228 days.

(21) Appl. No.: 17/756,316

(22) PCT Filed: Aug. 18, 2020

(86) PCT No.: PCT/JP2020/031046
§ 371 (c)(1),
(2) Date: May 22, 2022

(87) PCT Pub. No.: WO2021/106285
PCT Pub. Date: Jun. 3, 2021

(65) Prior Publication Data
US 2022/0413061 A1 Dec. 29, 2022

(30) Foreign Application Priority Data

Nov. 26, 2019 (JP) .................................. 2019-213256

(51) Int. Cl.
*G01R 31/52* (2020.01)
*H02H 3/17* (2006.01)

(52) U.S. Cl.
CPC ............... *G01R 31/52* (2020.01); *H02H 3/17* (2013.01)

(58) Field of Classification Search
CPC .......... G01R 31/52; G01R 35/00; H02H 3/17; H02H 3/044; B60L 3/0069
(Continued)

(56) References Cited

U.S. PATENT DOCUMENTS

| 10,073,128 B2 * | 9/2018 | Yoshioka ........... G01R 31/3644 |
| 2009/0134881 A1 * | 5/2009 | Tachizaki .............. B60L 3/0023 324/551 |
| 2011/0227052 A1 | 9/2011 | Kamatani et al. |

FOREIGN PATENT DOCUMENTS

| EP | 3214452 A1 * | 9/2017 | ............ B60L 3/0069 |
| JP | 2004347372 A * | 12/2004 | |

(Continued)

OTHER PUBLICATIONS

Extended European Search Report dated Dec. 21, 2022, issued in counterpart EP Application No. 20894879.4. (9 pages).
(Continued)

*Primary Examiner* — Thienvu V Tran
*Assistant Examiner* — Sreeya Sreevatsa
(74) *Attorney, Agent, or Firm* — WHDA, LLP

(57) ABSTRACT

A first voltage output unit generates a cyclic voltage that changes cyclically, and applies the cyclic voltage to the other end of a coupling capacitor via a first resistance. A second resistance and a third resistance are connected in series between a node and a second voltage output unit, the node being between the coupling capacitor and the first resistance. A voltage measurement unit measures a voltage at a voltage dividing point between the second resistance and the third resistance. In a period in which two types of fixed voltages are applied to the voltage dividing point in order, a diagnosing unit determines whether the leakage detecting device is in a normal state, based on the voltage measured by the voltage measurement unit.

7 Claims, 8 Drawing Sheets

(58) Field of Classification Search
USPC .......................................................... 361/42
See application file for complete search history.

(56) References Cited

FOREIGN PATENT DOCUMENTS

JP    2013032977 A  *  2/2013
WO    2010/058855      5/2010

OTHER PUBLICATIONS

International Search Report of PCT application No. PCT/JP2020/031046 dated Nov. 10, 2020.

* cited by examiner

Power supply system 5

Applied pulse waveform

Measured waveform

In the case of normal state (a)

In the case of minute current leak (circuit is in normal state)

(b)

In the case of abnormal state (c)

In the case of change in circuit constant (d)

Power supply system 5

EARTH LEAKAGE DETECTING DEVICE, AND VEHICULAR POWER SUPPLY SYSTEM

TECHNICAL FIELD

The present invention relates to a leakage detecting device that detects a current leakage from a load insulated from a ground, and to a vehicular power supply system.

BACKGROUND ART

Hybrid vehicles (HV), plug-in hybrid vehicles (PHV), and electric vehicles (EV) have become widespread in recent years. These electric vehicles are equipped with auxiliary batteries (which are, in general, lead batteries with power output of 12 V) and with drive batteries for high-voltage use (traction batteries), which are separated from the auxiliary batteries. To prevent an electric shock accident, a high-voltage circuit including a drive battery for high voltage use, an inverter, and a running motor is insulated from the body (chassis ground) of a vehicle.

A Y capacitor is provided between a positive line of the high-voltage circuit, the positive line being on a vehicle side, and the chassis ground and between a negative line of the high-voltage circuit, the negative line being on the vehicle side, and the chassis ground as well. This stabilizes power supply from the high-voltage drive battery to a load on the vehicle side. A leakage detecting device is incorporated in a vehicle to monitor insulation resistance between the high-voltage circuit and the chassis ground and detect a current leakage.

A leakage detecting device of an AC type applies a pulse voltage to a positive-electrode terminal or a negative-electrode terminal of the drive battery via a resistance and a coupling capacitor, and measures a voltage at a node between the resistance and the coupling capacitor, thereby detecting the presence or absence of a current leakage.

Meanwhile, a failure of the leakage detecting device of the AC type itself needs to be detected, too, and one of methods of diagnosing a failure of the leakage detecting device of the AC type is a method of applying a pulse voltage with a frequency sufficiently lower than the frequency of the pulse voltage for leak detection, comparing the applied voltage with a measured voltage, and determining that the device is in a normal state when both applied voltage and measured voltage are close to each other (see, for example, PTL 1).

CITATION LIST

Patent Literature

PTL 1: WO 2010/058855 A

SUMMARY OF THE INVENTION

When a current leakage from the coupling capacitor increases due to deterioration of the coupling capacitor, a leak current increases, the leak current flowing from the leakage detecting device to the chassis ground through the coupling capacitor and the high-voltage electric circuit of the vehicle. According to the above method of diagnosing a failure of the leakage detecting device, an increase in the leak current results in a drop in the applied pulse voltage, which creates a large difference between the applied voltage and the measured voltage. This increases a possibility that the leakage detecting device of a normal state may be determined to be that of an abnormal state. To prevent such an erroneous determination, criteria for determining whether both applied voltage and measured voltage are close to each other needs to be less strict. Less strict criteria, however, increases a possibility that the leakage detecting device of an abnormal state may be determined to be that of a normal state.

The present disclosure has been made in view of the above circumstance, and it is therefore an object of the present disclosure to provide a technique for highly precisely carrying out a failure diagnosis of a leakage detecting device.

In order to solve the above problems, a leakage detecting device according to an aspect of the present disclosure includes: a coupling capacitor in a state of being insulated from a ground, the coupling capacitor having one end connected to a current path of a power storage unit connected to a load; a first voltage output unit that generates a cyclic voltage that changes cyclically, the first voltage output unit applying the cyclic voltage to another end of the coupling capacitor via a first resistance; a second voltage output unit that outputs a fixed voltage; a second resistance and a third resistance that are connected in series between a node and the second voltage output unit, the node being between the coupling capacitor and the first resistance; a voltage measurement unit that measures a voltage at a voltage dividing point between the second resistance and the third resistance; a leakage determining unit that in a state of the cyclic voltage being outputted from the first voltage output unit, determines presence or absence of a current leakage between the current path of the power storage unit and the ground, based on a voltage measured by the voltage measurement unit; and a diagnosing unit that in a period of two types of fixed voltages being applied to the voltage dividing point in order, determines whether the leakage detecting device is in a normal state, based on a voltage measured by the voltage measurement unit.

According to the present disclosure, a diagnosis of a failure of the leakage detecting device can be carried out highly precisely.

BRIEF DESCRIPTION OF THE DRAWINGS

FIGS. 3(a) to 3(d) is a diagram showing an example of measured waveforms that are obtained at a failure diagnosis of the leakage detecting device according to the comparative example.

FIGS. 6(a) to 6(d) is a diagram showing an example of measured waveforms that are obtained at a failure diagnosis of the leakage detecting device according to the exemplary embodiment.

FIGS. 8(a) to 8(d) is a diagram showing an example of measured waveforms that are obtained at a failure diagnosis of a leakage detecting device according to a first modification.

FIGS. 9(a) to 9(d) is a diagram showing an example of measured waveforms that are obtained at a failure diagnosis of a leakage detecting device according to a second modification.

DESCRIPTION OF EMBODIMENT

Comparative Example

Figure 1:
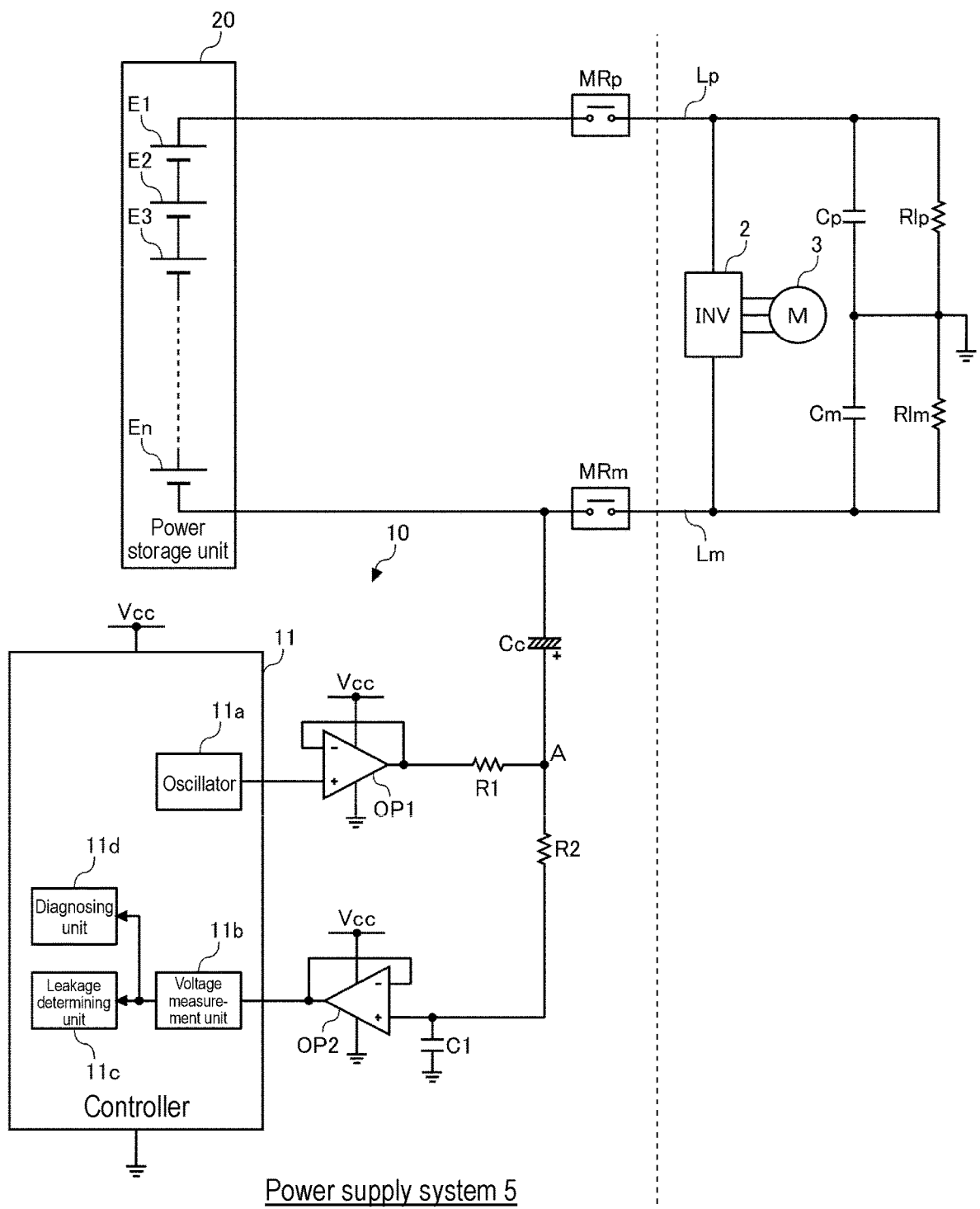
FIG. 1 is a diagram for explaining a configuration of a power supply system including a leakage detecting device according to a comparative example.

FIG. 1 is a diagram for explaining a configuration of power supply system 5 including leakage detecting device 10 according to a comparative example. Power supply system 5 is incorporated in an electric vehicle. In the electric vehicle, power supply system 5 is provided in separation from an auxiliary battery (which is usually a lead battery with power output of 12 V). Power supply system 5 includes power storage unit 20 for high voltage use and leakage detecting device 10. Power storage unit 20 includes a plurality of cells E1 to En connected in series. Lithium ion battery cells, nickel metal hydride battery cells, lead battery cells, electric double-layer capacitor cells, lithium ion capacitor cells, or the like can be used as cells E1 to En. Hereinafter, in this specification, it is assumed that lithium ion battery cells (with a nominal voltage ranging from 3.6 V to 3.7 V) are used as cells E1 to En.

The electric vehicle includes inverter 2 and motor 3 as loads for high voltage use. The positive electrode of power storage unit 20 is connected to one end of inverter 2 through positive line Lp, and the negative electrode of power storage unit 20 is connected to the other end of inverter 2 through negative line Lm. Positive line Lp is provided with positive-side main relay MRp, and negative line Lm is provided with negative-side main relay MRm. Positive-side main relay MRp and negative-side main relay MRm function as contactors that control electrical connection/disconnection between power storage unit 20 and the loads for high-voltage use in the electric vehicle. In place of these relays, semiconductor switches with high withstand voltage and insulation performance may be used.

Inverter 2 is a bidirectional inverter connected between power storage unit 20 and motor 3. In power running mode, inverter 2 converts DC power, which is supplied from power storage unit 20, into AC power and supplies the AC power to motor 3. In power regeneration mode, inverter 2 converts AC power, which is supplied from motor 3, into DC power and supplies the DC power to power storage unit 20. As motor 3, for example, a three-phase AC motor is used. In power running mode, motor 3 rotates in accordance with AC power supplied from inverter 2. In power regeneration mode, motor 3 converts rotational energy created by deceleration into AC power and supplied the AC power to inverter 2.

Power storage unit 20 is incorporated in the electric vehicle such that power storage unit 20 is kept insulated from a chassis ground of the electric vehicle. The auxiliary battery is incorporated in the electric vehicle such that the negative electrode of the auxiliary battery is electrically connected to the chassis ground. A part of positive line Lp that is closer to inverter 2 than positive-side main relay MRp is connected to the chassis ground via positive-side Y capacitor Cp. In addition, a part of negative line Lm that is closer to inverter 2 than negative-side main relay MRm is connected to the chassis ground via negative-side Y capacitor Cm. Positive-side Y capacitor Cp and negative-side Y capacitor Cm provide DC-based insulation between positive line Lp and the chassis ground and DC-based insulation between negative line Lm and the chassis ground, respectively, and exert an effect of stabilizing respective voltages of positive line Lp and negative line Lm.

When power storage unit 20 is insulated from the chassis ground in an ideal manner, an intermediate potential of power storage unit 20 is kept close to a potential of the chassis ground. For example, when a voltage across both ends of power storage unit 20 is 250 V, a positive electrode potential of power storage unit 20 is kept close to +125 V as a negative electrode potential of the same is kept close to −125 V. When power storage unit 20 for high voltage use and the chassis ground are in a state of being electrically connected to each other, a person's touching an exposed conductive part of the electric vehicle is so dangerous that it may give an electric shock to the person. For this reason, it is necessary that the electric vehicle including power storage unit 20 for high voltage use be equipped with leakage detecting device 10 to monitor a state of insulation between a current path of power storage unit 20, which is connected to vehicle loads for high voltage use, and the chassis ground. In FIG. 1, a state of insulation between positive line Lp and the chassis ground is expressed as positive-side leakage resistance Rlp, and a state of insulation between negative line Lm and the chassis ground is expressed as negative-side leakage resistance Rlm.

In the comparative example, leakage detecting device 10 includes coupling capacitor Cc, first resistance R1, first operational amplifier OP1, second resistance R2, smoothing capacitor C1, second operational amplifier OP2, and controller 11. Controller 11 includes oscillator 11a, voltage measurement unit 11b, leakage determining unit 11c, and diagnosing unit 11d. Controller 11 may be composed of, for example, a microcomputer and a nonvolatile memory (e.g., an electrically erasable programmable read-only memory (EEPROM), a flash memory, or the like).

Coupling capacitor Cc has one end connected to the current path of power storage unit 20. In the example shown in FIG. 1, the one end of coupling capacitor Cc is connected to the negative electrode of power storage unit 20. The one end of coupling capacitor Cc may be connected to the positive electrode of power storage unit 20 or may be connected to a node of one of the plurality of cells E1 to En in power storage unit 20. The other end of coupling capacitor Cc is connected to an output end of a voltage output unit via first resistance R1. A node between the other end of coupling capacitor Cc and first resistance R1 serves as measurement point A. A different impedance element may be used in place of first resistance R1.

In FIG. 1, as coupling capacitor Cc, an aluminum electrolytic capacitor is used, which can be increased in capacity at relatively low cost. The aluminum electrolytic capacitor has polarity. In FIG. 1, the positive electrode of the aluminum electrolytic capacitor is connected to measurement point A, while the negative electrode of the aluminum electrolytic capacitor is connected to the negative electrode of power storage unit 20. Coupling capacitor Cc may be composed of a plurality of aluminum electrolytic capacitors connected in series. In this case, even if one capacitor short-circuits, the rest of the capacitors maintain DC-based insulation.

The above voltage output unit generates a cyclic voltage that changes cyclically, and applies the generated cyclic voltage to the other end of coupling capacitor Cc via first resistance R1. Hereinafter, in the present specification, it is assumed that a rectangular wave voltage is used as the cyclic voltage.

The voltage output unit includes oscillator 11a and first operational amplifier OP1. Oscillator 11a includes a multivibrator or a local oscillator, and generates a rectangular wave with a preset frequency. The rectangular wave voltage generated by oscillator 11a is input to a non-inverting input terminal of first operational amplifier OP1. An output terminal of first operational amplifier OP1 is connected to first resistance R1. An inverting input terminal of first operational amplifier OP1 is connected to an output terminal of the same. A positive power source terminal of first operational amplifier OP1 is connected to a first fixed potential node (power source potential Vcc), and a negative power source terminal of first operational amplifier OP1 is connected to a second fixed potential node (ground potential GND). Hereinafter, in the present specification, it is assumed that power source potential Vcc is 5 V and ground potential GND is 0 V.

First operational amplifier OP1 functions as a voltage follower that performs only impedance conversion with an amplification factor of 1. In place of first operational amplifier OP1, an AND gate having one input terminal connected to the first fixed potential node or an OR gate having one input terminal connected to the second fixed potential node may be used. First operational amplifier OP1 may be substituted by any element that functions as a buffer that separates the impedance of controller 11 from the impedance of measurement point A.

Measurement point A is connected to a non-inverting input terminal of second operational amplifier OP2 via second resistance R2. An inverting input terminal of second operational amplifier OP2 is connected to an output terminal of the same. Second operational amplifier OP2 also functions as a voltage follower that performs only impedance conversion with an amplification factor of 1. Smoothing capacitor C1 is connected between the non-inverting input terminal of second operational amplifier OP2 and the second fixed potential node (ground potential GND). Smoothing capacitor C1 removes noise from voltage input to the non-inverting input terminal of second operational amplifier OP2.

Second operational amplifier OP2 outputs a voltage at measurement point A to voltage measurement unit 11b. Voltage measurement unit 11b measures the voltage at measurement point A. Voltage measurement unit 11b includes an A/D converter, and the A/D converter samples an analog voltage at measurement point A at points of time synchronizing with points of time of rising edges and falling edges of a rectangular wave voltage generated by oscillator 11a, and converts the sampled analog voltage into a digital value. The voltage sampled at points of time of rising edges of the rectangular wave voltage corresponds to lower peak values of a voltage waveform resulting from the sampling, and the voltage sampled at points of time of falling edges of the rectangular wave voltage corresponds to upper peak values of the voltage waveform resulting from the sampling. It should be noted that, in consideration of distortion of the rectangular wave voltage, timing of sampling for the lower peak values and timing of sampling for the upper peak values may be adjusted. Voltage measurement unit 11b outputs the voltage at measurement point A to leakage determining unit 11c and to diagnosing unit 11d.

Leakage determining unit 11c determines the presence or absence of a current leakage between the current path of power storage unit 20 and the chassis ground, based on the voltage at measurement point A measured by voltage measurement unit 11b. When a peak-to-peak value indicated by a difference between an upper peak value and a lower peak value is smaller than a set value, leakage determining unit 11c determines that a current leakage has occurred between the current path of power storage unit 20 and the chassis ground. The set value is determined, based on a peak-to-peak value of a voltage waveform measured at the occurrence of a current leakage, the peak-to-peak value being derived in advance through an experiment or simulation by a designer. When a current leakage has occurred between the current path of power storage unit 20 and the chassis ground, an alternating current flows from first operational amplifier OP1 to coupling capacitor Cc via first resistance R1 working as a detection resistance. A current flowing through first resistance R1 causes a voltage drop, which reduces the amplitude of the voltage at measurement point A.

Figure 2:
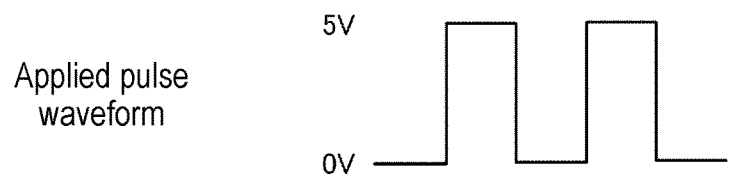
FIG. 2 is a diagram showing an example of an applied pulse waveform and a measured voltage waveform.
Figure 2:
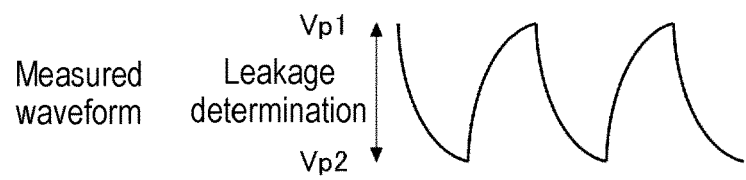

FIG. 2 is a diagram showing an example of an applied pulse waveform and a measured voltage waveform. A pulse waveform applied from the voltage output unit to measurement point A has a high-side potential set to 5 V and a low-side potential set to 0 V. Leakage determining unit 11c identifies upper peak value Vp1 and lower peak value Vp2 of a voltage waveform measured in a period during which the pulse voltage is kept applied to measurement point A, and determines the presence or absence of a current leakage, based on a peak-to-peak value defined as a difference between upper peak value Vp1 and lower peak value Vp2.

Now FIG. 1 will be referred to again. Diagnosing unit 11d determines whether leakage detecting device 10 is in a normal state, based on a voltage measured by voltage measurement unit 11b. In other words, diagnosing unit 11d determines whether leakage detecting device 10 itself has a failure. When a failure diagnosis of leakage detecting device 10 is carried out, a pulse voltage with a frequency sufficiently lower than the frequency of the voltage for leakage detection is applied to measurement point A. For example, a 10 Hz pulse voltage may be applied at leak detection, and a 1 Hz pulse voltage may be applied at failure diagnosis of leakage detecting device 10.

Figure 3:
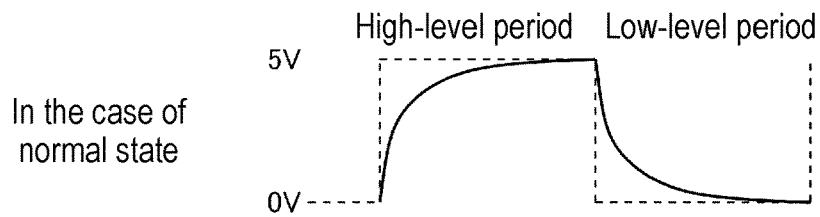
FIG. 3 including
Figure 3:
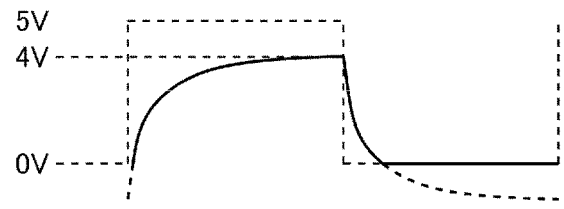
Figure 3:
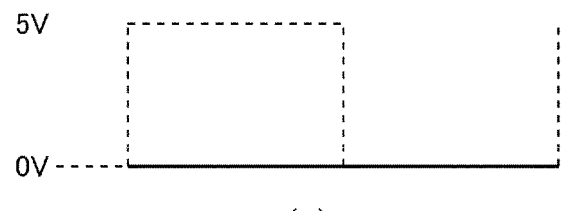
Figure 3:
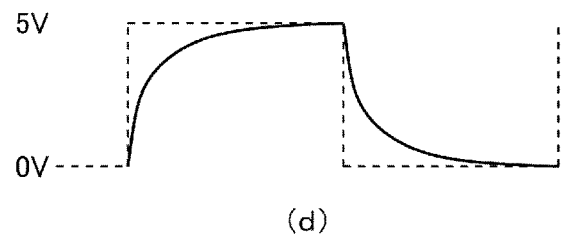

FIGS. 3(a) to 3(d) are diagrams showing an example of measured waveforms that are obtained at a failure diagnosis of leakage detecting device 10 according to the comparative example. FIG. 3(a) shows an example of a measured waveform in a case of leakage detecting device 10 being in the normal state. When a path leading from oscillator 11a through first operational amplifier OP1, first resistance R1, second resistance R2, and second operational amplifier OP2 to the voltage measurement unit 11b is in a normal state, a pulse voltage outputted from oscillator 11a is measured in its original form by voltage measurement unit 11b. It should be noted that a measured waveform is distorted due to the influence of smoothing capacitor C1. When a voltage measured during the high-level period of the applied pulse voltage is close to a first reference voltage (which is 5 V in the comparative example) and a voltage measured during the low-level period of the same is close to a second reference voltage (which is 0 V in the comparative example), diagnosing unit 11d determines that leakage detecting device 10 is in the normal state.

Meanwhile, when coupling capacitor Cc deteriorates, a leak current increases. In a case of using an aluminum electrolytic capacitor as coupling capacitor Cc, leaving coupling capacitor Cc in a non-load state for a long period is likely to result in an increase in the leak current.

Figure 4:
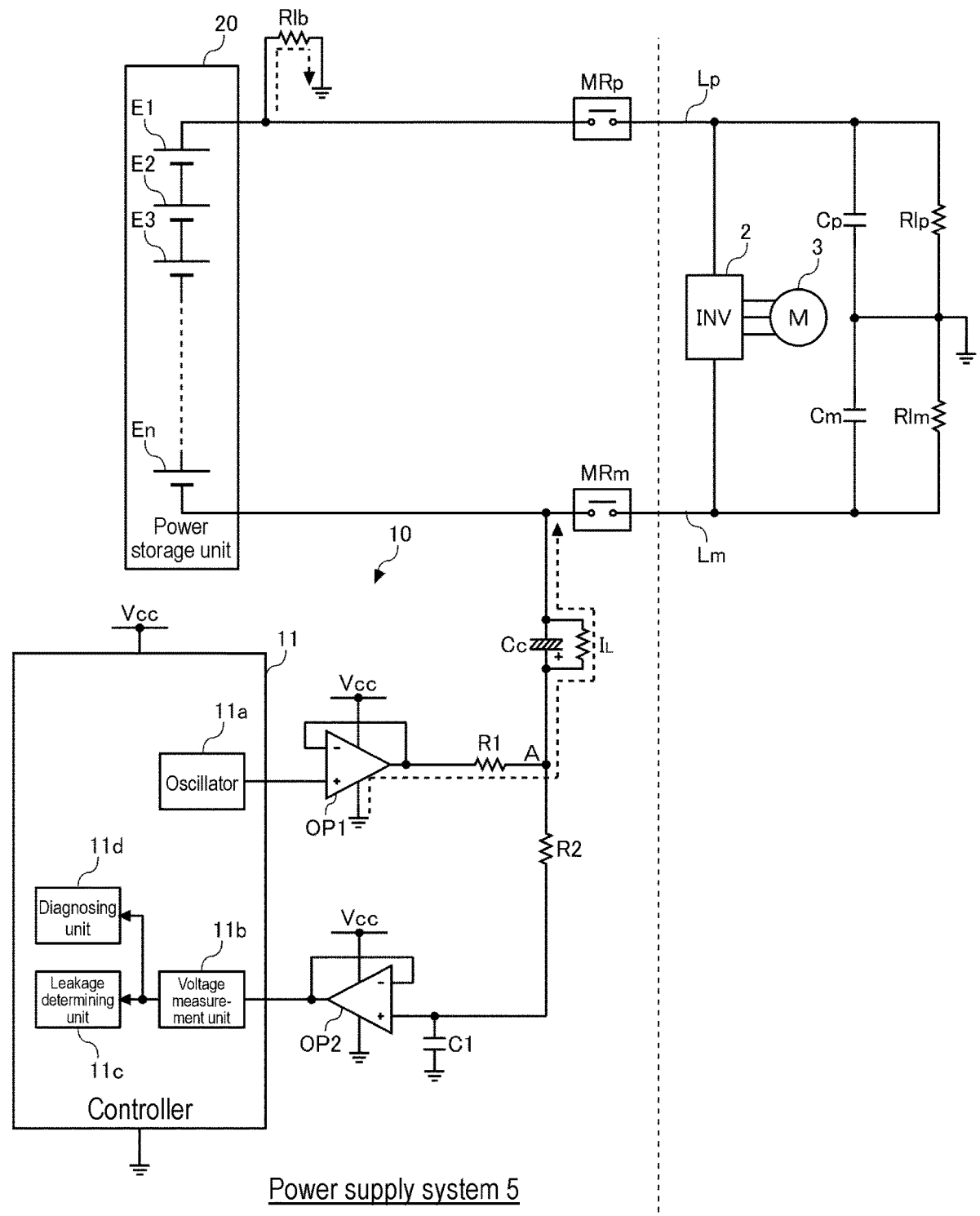
FIG. 4 is a diagram showing an example of a leak path of the power supply system including the leakage detecting device according to the comparative example.

FIG. 4 is a diagram showing an example of a leak path of power supply system 5 including leakage detecting device 10 according to the comparative example. Between the current path of power storage unit 20 and the chassis ground, even under a normal condition, a minute leak current flows as leakage resistance ranges from several tens of MΩ to 100 MΩ. Even when positive-side main relay MRp and negative-side main relay MRm are off (opened), a minute leak current flows between the current path of power storage unit 20 and the chassis ground (see leakage resistance Rlb). When the insulation resistance of coupling capacitor Cc drops, a minute leak current flows through a path leading from first operational amplifier OP1 through first resistance R1, coupling capacitor Cc, and power storage unit 20 to leakage resistance Rlb. For example, when the resistance value of first resistance R1 is set to 200 kΩ, if the insulation resistance of coupling capacitor Cc drops to about 20 MΩ, the leak current exerts its influence on a pulse voltage generated by a 5 V power supply, causing a measured pulse voltage waveform a voltage drop of about 1 V.

FIG. 3(b) shows an example of a measured waveform in a case where a minute leak current flows from first operational amplifier OP1 to the chassis ground. The circuit itself of leakage detecting device 10 is in the normal state. FIG. 3(b) demonstrates that the measured waveform as a whole drops in voltage level due to the influence of the leak current. In the examples of FIGS. 3(a) to 3(d), a measurement circuit incapable of detecting a voltage lower than 0 V is used. For this reason, the measured voltage is clamped to 0 V in most of the low-side period of the applied pulse voltage.

FIG. 3(c) shows an example of a measured waveform in a case where leakage detecting device 10 is in an abnormal state. FIG. 3(c) demonstrates that a voltage around 0 V is measured in both the high-level period and the low-level period of the applied pulse voltage. When a voltage measured during the high-level period of the applied pulse voltage is different from the first reference voltage (which is 5 V in the comparative example) by a specified value or more, diagnosing unit 11d determines that leakage detecting device 10 is in the abnormal state. For example, when any part of the path leading from oscillator 11a through first operational amplifier OP1, first resistance R1, second resistance R2, and second operational amplifier OP2 to voltage measurement unit 11b is disconnected, a voltage around 0 V is measured also in the high-level period of the applied pulse voltage. In other cases where a short failure or an open failure occurs at any of circuit elements, the voltage measured in the high-level period is widely different from the first reference voltage.

FIG. 3(d) shows an example of a measured waveform in a case where the constant of a circuit element used in leakage detecting device 10 changes. In the comparative example, even when the constant of a circuit element changes, the measured waveform of the applied pulse voltage hardly changes from the same in the case of leakage detecting device 10 being in the normal state. For example, when the resistance value of first resistance R1 drops from 200 kΩ to 100 kΩ because of deterioration of first resistance R1, the measured waveform of the pulse voltage hardly changes.

As indicated in FIG. 3(b), a method of diagnosis of leakage detecting device 10 according to the comparative example is widely affected by the minute leakage current flowing from first operational amplifier OP1 to the chassis ground. In the example shown in FIG. 3(b), since the circuit itself of leakage detecting device 10 is in the normal state, diagnosing unit 11d is expected to give a determination that leakage detecting device 10 is in the normal state. Actually, however, a measurement of the applied pulse voltage in the high-side period turns out to be around 4 V, which is widely different from 5 V that is the original theoretical value. To allow determining this state to be a normal state, a margin of about 1 V needs to be added to the specified value for the determination, which means that the criteria need to be widely relaxed. Taking such an approach leads to a case where a small failure of a circuit element is overlooked. In addition, as indicated in FIG. 3(d), by the method of diagnosis of leakage detecting device 10 according to the comparative example, detecting a change in the constant of a circuit element is difficult. Specifically, detecting deterioration of first resistance R1 is difficult.

Exemplary Embodiment

Figure 5:
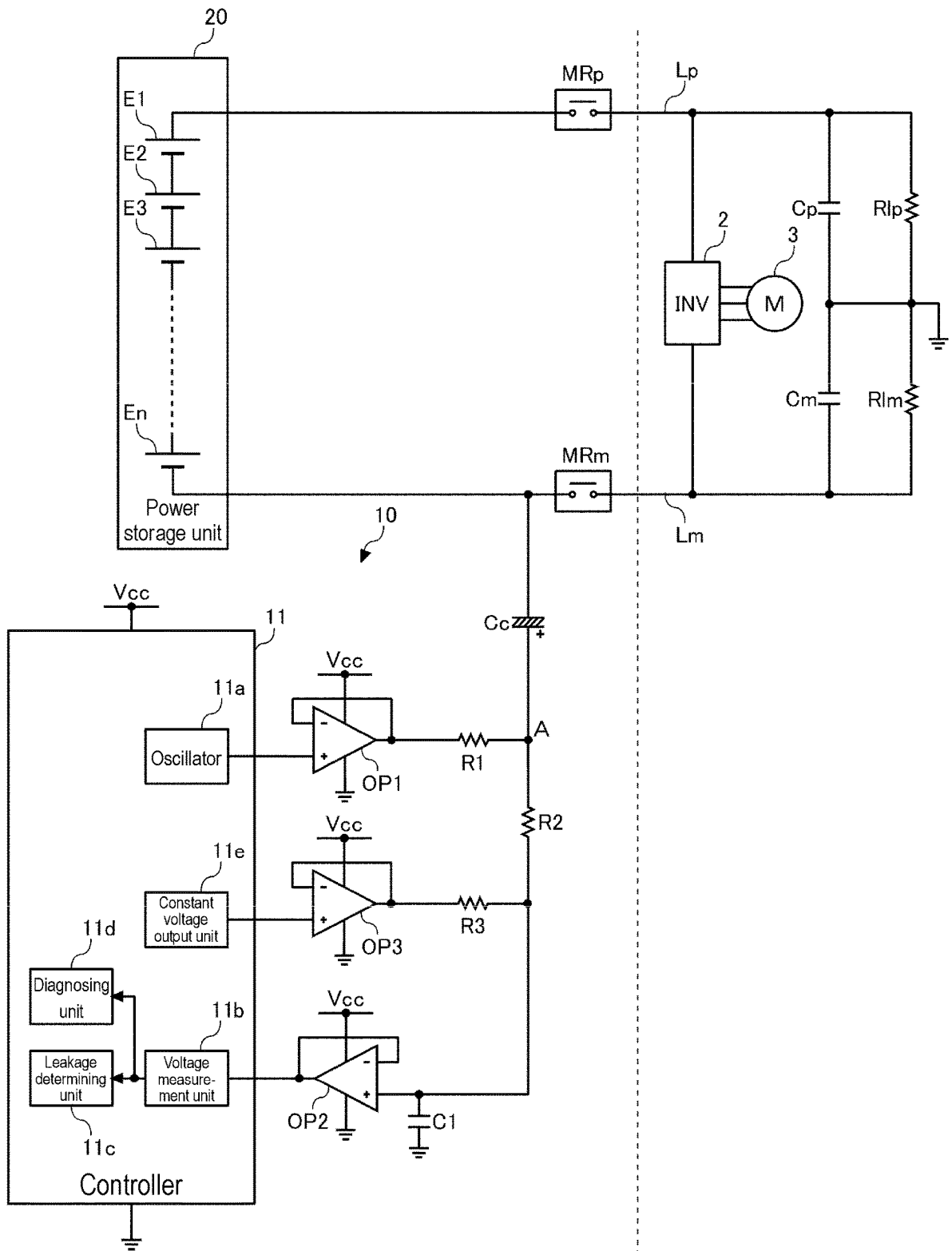
FIG. 5 is a diagram for explaining a configuration of a power supply system including a leakage detecting device according to an exemplary embodiment.

FIG. 5 is a diagram for explaining a configuration of power supply system 5 including leakage detecting device 10 according to an exemplary embodiment. Hereinafter, differences in configuration with power supply system 5 according to the comparative example shown in FIG. 1 will be described. In the exemplary embodiment, leakage detecting device 10 additionally includes third resistance R3 and third operational amplifier OP3. Controller 11 further includes constant voltage output unit 11e. Constant voltage output unit 11e can output two types of fixed voltages: the first reference voltage (which is 5 V in the present exemplary embodiment) and the second reference voltage (which is 0 V in the present exemplary embodiment).

In the present exemplary embodiment, oscillator 11a and first operational amplifier OP1 make up a first voltage output unit, and constant voltage output unit 11e and third operational amplifier OP3 make up a second voltage output unit. In the present exemplary embodiment, the first voltage output unit is also configured to be capable of outputting the two types of fixed voltages, i.e., the first reference voltage and the second reference voltage.

Second resistance R2 and third resistance R3 are connected in series between node A and the second voltage output unit, node A being between coupling capacitor Cc and first resistance R1. More specifically, a constant voltage outputted from constant voltage output unit 11e is inputted to a non-inverting input terminal of third operational amplifier OP3. An output terminal of third operational amplifier OP3 is connected to third resistance R3. An inverting input terminal of third operational amplifier OP3 is connected to the output terminal of the same. Third operational amplifier OP3 also functions as a voltage follower that performs only impedance conversion with an amplification factor of 1.

In the present exemplary embodiment, a voltage at a voltage dividing point between second resistance R2 and third resistance R3 is input to the non-inverting input terminal of second operational amplifier OP2. In other words, by measuring the voltage at the voltage dividing point between second resistance R2 and third resistance R3, voltage measurement unit 11b measures a voltage at measurement point A in its compressed form. Based on the amplitude value of the voltage measured by voltage measurement unit 11b, leakage determining unit 11c calculates a leakage resistance value, referring to a leakage resistance conversion table, thereby determining the presence or absence of a current leakage between the current path of power storage unit 20 and the chassis ground. In the present exemplary embodiment, the voltage at measurement point A is measured in the form of a divided voltage. This reduces periods in which the voltage at measurement point A is out of a measurement range (which is a range of 0 V to 5 V, inclusive in the present exemplary embodiment). In other words, periods in which leakage determination cannot be made are reduced.

In a period in which the two types of fixed voltages are outputted in order from the first voltage output unit, diagnosing unit 11d determines whether leakage detecting device 10 is in the normal state, based on the voltage measured by voltage measurement unit 11b. Specifically, diagnosing unit 11d calculates a difference between a voltage measured in a first state in the period and a voltage measured in a second state in the period, and determines that leakage detecting device 10 is in the normal state when the difference is within a set range. The first state and the second state each continue for several seconds (e.g., 4 seconds).

FIGS. 6(a) to 6(d) are diagrams showing an example of measured waveforms that are obtained at a failure diagnosis of leakage detecting device 10 according to the exemplary embodiment. In the following example, it is assumed that the resistance value of first resistance R1 is set to 200 kΩ, the resistance value of second resistance R2 is set to 1000 kΩ, and the resistance value of third resistance R3 is set to 1000 kΩ. It is also assumed that in the first state, the first voltage output unit outputs the first reference voltage (which is 5 V in the present exemplary embodiment) while the second voltage output unit outputs the second reference voltage (which is 0 V in the present exemplary embodiment), and that in the second state, the first voltage output unit outputs the second reference voltage while the second voltage output unit outputs the first reference voltage.

Figure 6:
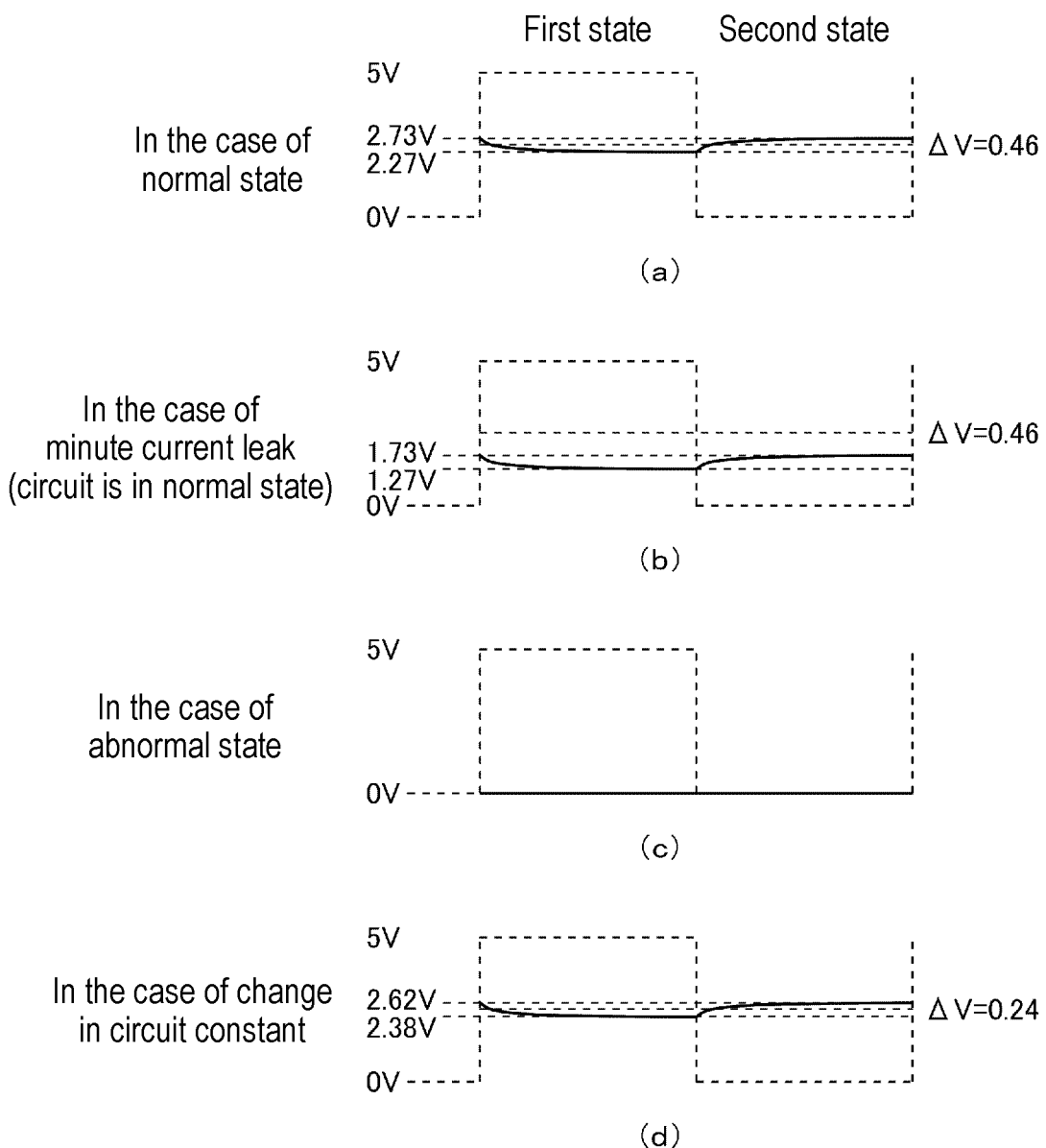
FIG. 6 including

FIG. 6(a) shows an example of a measured waveform in a case where leakage detecting device 10 is in the normal state. When the first voltage output unit, first resistance R1, second resistance R2, third resistance R3, the second voltage output unit, second operational amplifier OP2, and voltage measurement unit 11b are in the normal state, about 2.27 V is measured in the first state, and about 2.73 V is measured in the second state. A theoretical value for the measured voltage in the first state and a theoretical value for the measured voltage in the second state are given by the following (Formula 1) and (Formula 2).

$$5 \times (1000/(200+1000+1000)) \approx 2.27 \quad \text{(Formula 1)}$$

$$5 \times ((200+1000)/(200+1000+1000)) \approx 2.73 \quad \text{(Formula 2)}$$

Diagnosing unit 11d calculates differential voltage ΔV between both theoretical values. In this example, differential voltage ΔV is calculated as 0.46 V. When differential voltage ΔV is within a set range, diagnosing unit 11d determines that leakage detecting device 10 is in the normal state. The set range is determined to be a range in which optimum precision is achieved, based on data obtained by experiments or simulations by the designer.

Figure 7:
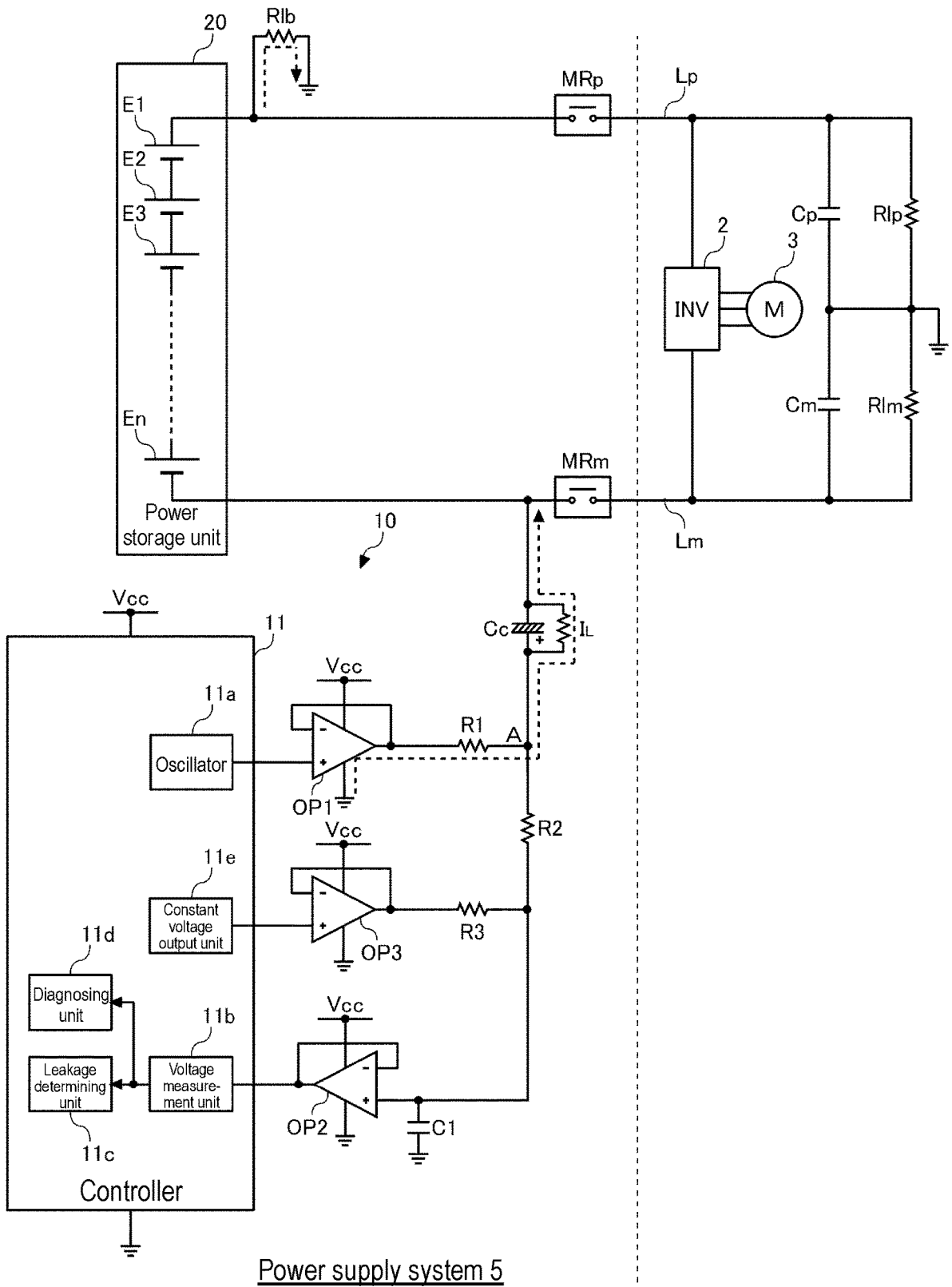
FIG. 7 is a diagram showing an example of a leak path of a power supply system including the leakage detecting device according to the exemplary embodiment.

In the present exemplary embodiment, in the same manner as in the comparative example, deterioration of coupling capacitor Cc leads to an increase in a leak current. FIG. 7 is a diagram showing an example of a leak path of power supply system 5 including leakage detecting device 10 according to the exemplary embodiment.

FIG. 6(b) shows an example of a measured waveform in a case where a minute leak current flows from first operational amplifier OP1 to the chassis ground. The circuit itself of leakage detecting device 10 is in the normal state. FIG. 6(b) demonstrates that the measured waveform as a whole drops in voltage level by 1 V due to the influence of the leak current. About 1.27 V is measured in the first state, and about 1.72 V is measured in the second state. Differential voltage ΔV, i.e., a difference between these measured voltages is 0.46 V.

FIG. 6(c) shows an example of a measured waveform in a case where leakage detecting device 10 is in the abnormal state. FIG. 6(c) demonstrates that a voltage around 0 V is measured in both the first state and the second state. Differential voltage ΔV, i.e., a difference between these measured voltages is 0 V. Because differential voltage ΔV is out of the given set range (of which the center value is 0.46 V), diagnosing unit 11d determines that leakage detecting device 10 is in the abnormal state.

FIG. 6(d) shows an example of a measured waveform in a case where the constant of a circuit element used in leakage detecting device 10 has changed. The measured waveform shown in FIG. 6(d) is a measured waveform that results when the resistance value of first resistance R1 drops from 200 kΩ to 100 kΩ because of deterioration of first resistance R1. About 2.38 V is measured in the first state, and about 2.62 V is measured in the second state. When the resistance value of first resistance R1 is 100 kΩ, a theoretical value for the measured voltage in the first state and a theoretical value for the measured voltage in the second state are given by the following (Formula 3) and (Formula 4).

$$5 \times (1000/(100+1000+1000)) \approx 2.38 \quad \text{(Formula 3)}$$

$$5 \times ((100+1000)/(100+1000+1000)) \approx 2.62 \quad \text{(Formula 4)}$$

Differential voltage ΔV, i.e., a difference between these measured voltages is 0.24 V. Because differential voltage ΔV is out of the given set range (of which the center value is 0.46 V), diagnosing unit 11d determines that leakage detecting device 10 is in the abnormal state.

As described above, according to the present exemplary embodiment, by determining whether differential voltage ΔV between the first state and the second state falls within the set range in the period in which the two types of fixed voltages are applied to the voltage dividing point in order, a failure diagnosis of leakage detecting device 10 can be carried out highly precisely. Specifically, even when a minute leak current flows from first operational amplifier OP1 to the chassis ground, the value of differential voltage ΔV is almost the same as that in the case of the normal state, as indicated in FIG. 6(b). In this case, therefore, a failure diagnosis of leakage detecting device 10 can be carried out under little influence of the minute leakage current. In contrast, in the comparative example as shown in FIG. 3(b), the influence of the minute leakage current is greater. In the present exemplary embodiment, providing the set range with a large margin is unnecessary, which reduces cases of overlooking a minor problem with a circuit element.

In addition, as indicated in FIG. 6(d), according to the present exemplary embodiment, a change in the constant of a circuit element can be detected. Specifically, deterioration of first resistance R1 functioning as a detection resistance can be detected. In contrast, detecting a change in the constant of the circuit element is difficult in the comparative example, as indicated in FIG. 3(d).

(First Modification)

FIGS. 8(a) to 8(d) show an example of measured waveforms that are obtained at a failure diagnosis of leakage detecting device 10 according to a first modification. In the first modification, the configuration of leakage detecting device 10 is the same as the configuration of leakage detecting device 10 shown in FIG. 5. It is assumed that in the first modification, the resistance value of first resistance R1 is set to 200 kΩ, the resistance value of second resistance R2 is set to 1000 kΩ, and the resistance value of the third resistance R3 is set to 1000 kΩ. It is also assumed that in the first state, the first voltage output unit outputs the first reference voltage (which is 5 V in the first modification, too) while the second voltage output unit outputs the first reference voltage, and that in the second state, the first voltage output unit outputs the first reference voltage while the second voltage output unit outputs the second reference voltage (which is 0 V in the first modification, too).

Figure 8:
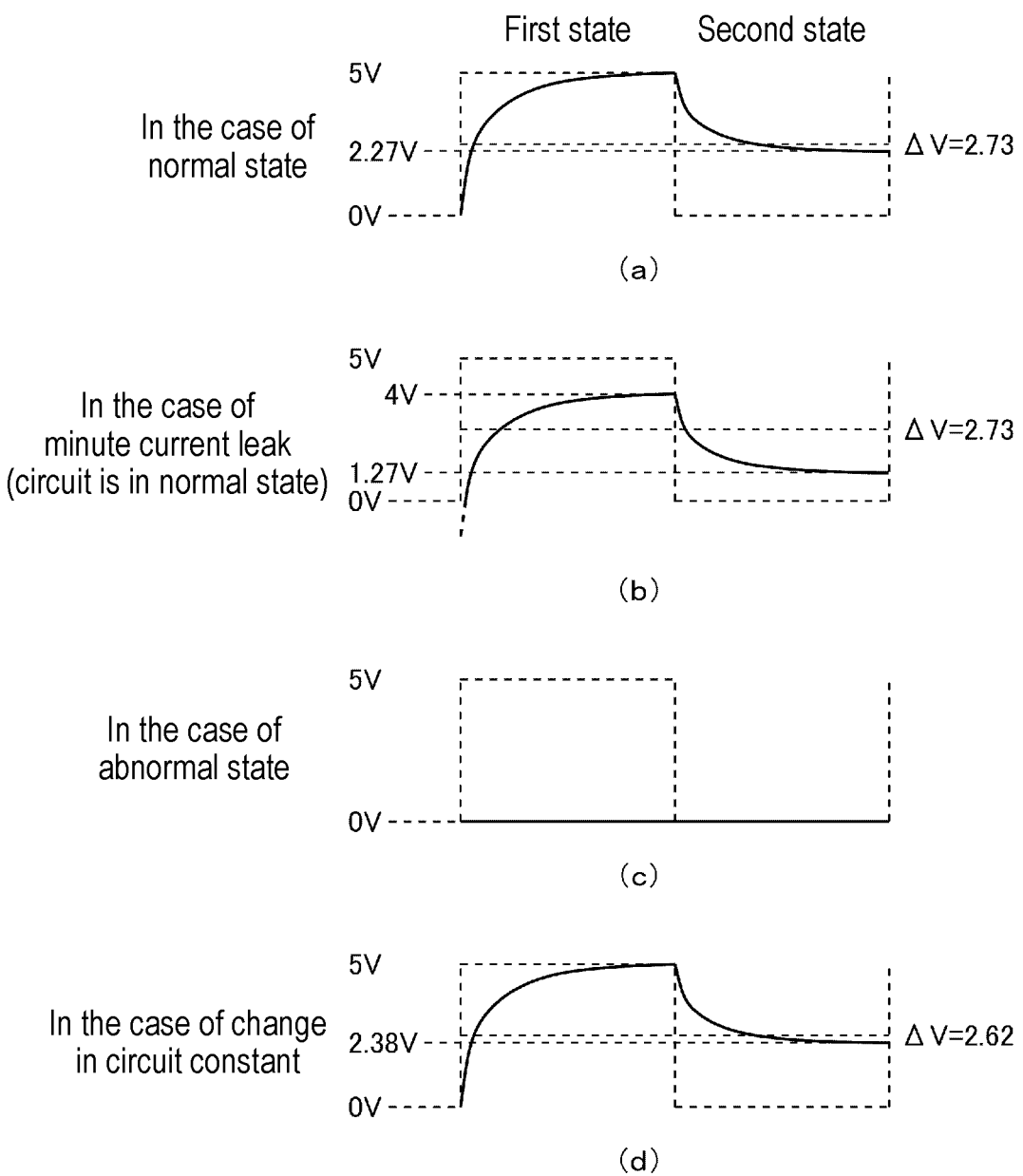
FIG. 8 including

FIG. 8(a) shows an example of a measured waveform in a case where leakage detecting device 10 is in the normal state. When the first voltage output unit, first resistance R1, second resistance R2, third resistance R3, the second voltage output unit, second operational amplifier OP2, and voltage measurement unit 11b are in the normal state, about 5 V is measured in the first state, and about 2.27 V is measured in the second state. Because 5 V is applied across both ends of first resistance R1, second resistance R2, and third resistance R3 connected in series in the first state, a theoretical value for the measured voltage in the first state is also 5 V. A theoretical value for the measured voltage in the second state is given by the above (Formula 1).

Diagnosing unit 11d calculates differential voltage ΔV between both theoretical values. In this example, differential voltage ΔV is calculated as 2.73 V. When differential voltage ΔV is within a set range, diagnosing unit 11d determines that leakage detecting device 10 is in the normal state.

FIG. 8(b) shows an example of a measured waveform in a case where a minute leak current flows from first operational amplifier OP1 to the chassis ground. The circuit itself of leakage detecting device 10 is in the normal state. FIG. 8(b) demonstrates that the measured waveform as a whole drops in voltage level by 1 V due to the influence of the leak current. About 4 V is measured in the first state, and about 1.27 V is measured in the second state. Differential voltage ΔV, i.e., a difference between both measured voltages is 2.73 V. Because differential voltage ΔV falls within the given set range (of which the center value is 2.73 V), diagnosing unit 11d determines that electrical leakage detecting device 10 is in the normal state.

FIG. 8(c) shows an example of a measured waveform in a case where leakage detecting device 10 is in the abnormal state. FIG. 8(c) demonstrates that a voltage around 0 V is measured in both the first state and the second state. Differential voltage ΔV, i.e., a difference between these measured voltages is 0 V. Because differential voltage ΔV is out of the given set range (of which the center value is 2.73 V), diagnosing unit 11d determines that leakage detecting device 10 is in the abnormal state.

FIG. 8(d) shows an example of a measured waveform in a case where the constant of a circuit element used in leakage detecting device 10 has changed. The measured waveform shown in FIG. 8(d) is a measured waveform that results when the resistance value of the first resistance R1 drops from 200 kΩ to 100 kΩ because of deterioration of first resistance R1. About 5 V is measured in the first state, and about 2.38 V is measured in the second state. Because 5 V is applied across both ends of first resistance R1, second resistance R2, and third resistance R3 connected in series in the first state, a theoretical vale for the measured voltage in the first state is also 5 V, regardless of the resistance value of the first resistance. A theoretical value for the measured voltage in the second state is given by the above (Formula 3). Differential voltage ΔV, i.e., a difference between both measured voltages is 2.62 V. Because differential voltage ΔV is out of the given set range (of which the center value is 2.73 V), diagnosing unit 11d determines that leakage detecting device 10 is in the abnormal state.

As described above, according to the first modification, even if the first voltage output unit continuously outputs the same voltage in the first state and the second state, the same effect as that of the above exemplary embodiment is achieved by switching the output voltage from the second voltage output unit. The first voltage output unit may continuously output the second reference voltage, instead of continuously outputting the first reference voltage.

(Second Modification)

FIGS. 9(a) to 9(d) are diagrams showing an example of measured waveforms that are obtained at a failure diagnosis of leakage detecting device 10 according to a second modification. In the first modification, the configuration of leakage detecting device 10 is the same as the configuration of leakage detecting device 10 shown in FIG. 5. It is assumed that in the second modification, the resistance value of first resistance R1 is set to 200 kΩ, the resistance value of second resistance R2 is set to 1000 kΩ, and the resistance value of third resistance R3 is set to 1000 kΩ It is also assumed that in the first state, the first voltage output unit outputs the first reference voltage (which is 5 V in the second modification, too) while the second voltage output unit outputs the first reference voltage, and that in the second state, the first voltage output unit outputs the second reference voltage (which is 0 V in the second modification, too) while the second voltage output unit outputs the first reference voltage.

FIG. 9(a) shows an example of a measured waveform in a case where leakage detecting device 10 is in the normal state. When the first voltage output unit, first resistance R1, second resistance R2, third resistance R3, the second voltage output unit, second operational amplifier OP2, and voltage measurement unit 11b are in the normal state, about 5 V is measured in the first state, and about 2.73 V is measured in the second state. Because 5 V is applied across both ends of first resistance R1, second resistance R2, and third resistance R3 connected in series in the first state, a theoretical vale for the measured voltage in the first state is also 5 V. A theoretical value for the measured voltage in the second state is given by the above (Formula 2).

Diagnosing unit 11d calculates differential voltage ΔV between both theoretical values. In this example, differential voltage ΔV is calculated as 2.27 V. When differential voltage ΔV is within a set range, diagnosing unit 11d determines that leakage detecting device 10 is in the normal state.

Figure 9:
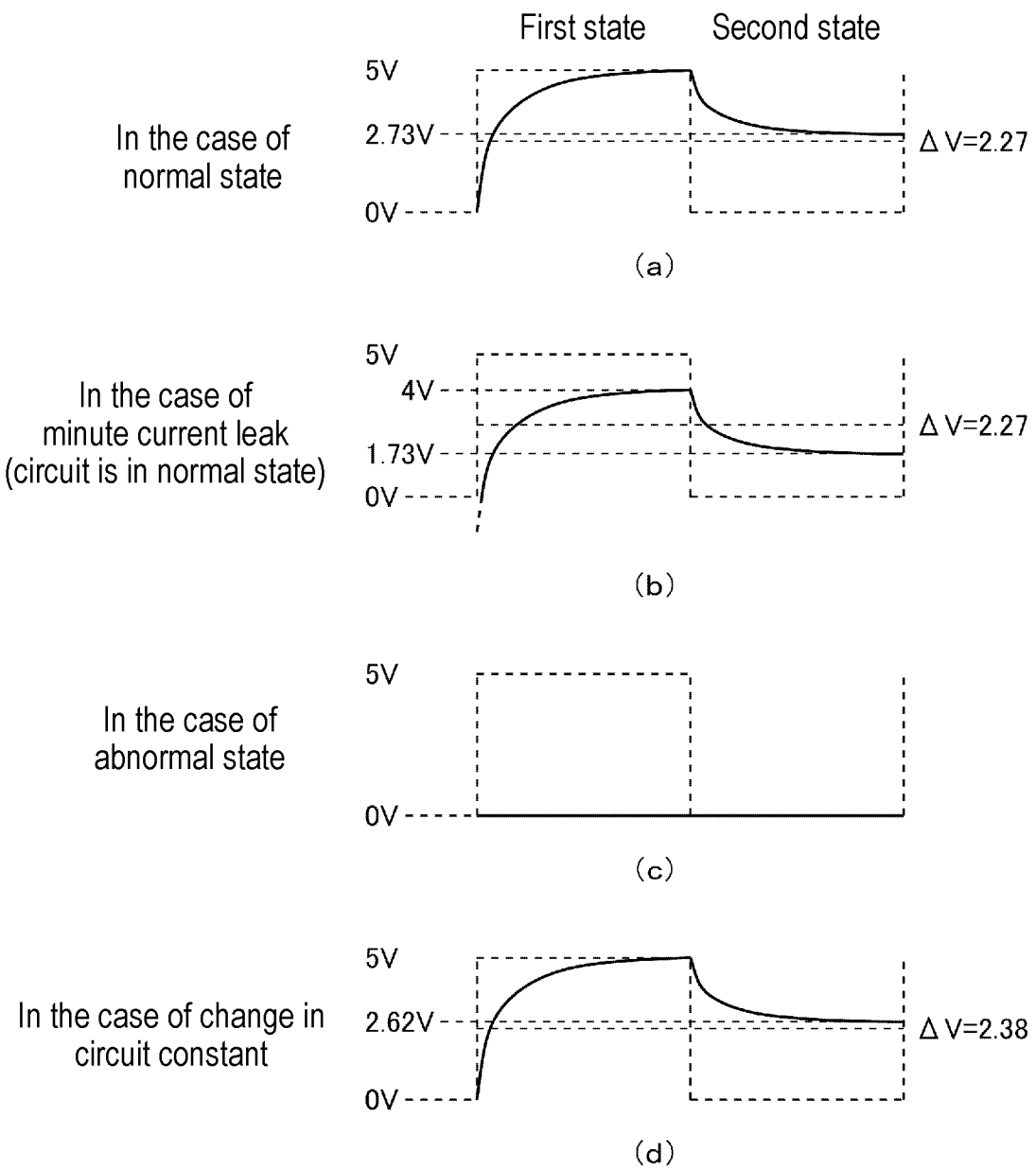
FIG. 9 including

FIG. 9(b) shows an example of a measured waveform in a case where a minute leak current flows from first operational amplifier OP1 to the chassis ground. The circuit itself of leakage detecting device 10 is in the normal state. FIG. 9(b) demonstrates that the measured waveform as a whole drops in voltage level by 1 V due to the influence of the leak current. About 4 V is measured in the first state, and about 1.73 V is measured in the second state. Differential voltage ΔV, i.e., a difference between both measured voltages is 2.27 V. Because differential voltage ΔV falls within the given set range (of which the center value is 2.27 V), diagnosing unit 11d determines that electrical leakage detecting device 10 is in the normal state FIG. 9(c) shows an example of a measured waveform in a case where leakage detecting device 10 is in the abnormal state. FIG. 9(c) demonstrates that a voltage around 0 V is measured in both the first state and the second state. Differential voltage ΔV, i.e., a difference between these measured voltages is 0 V. Because differential voltage ΔV is out of the given set range (of which the center value is 2.27 V), diagnosing unit 11*d* determines that leakage detecting device 10 is in the abnormal state FIG. 9(*d*) shows an example of a measured waveform in a case where the constant of a circuit element used in leakage detecting device 10 has changed. The measured waveform shown in FIG. 9(*d*) is a measured waveform that results when the resistance value of first resistance R1 drops from 200 kΩ to 100 kΩ because of deterioration of first resistance R1. About 5 V is measured in the first state, and about 2.62 V is measured in the second state. Because 5 V is applied across both ends of first resistance R1, second resistance R2, and third resistance R3 connected in series in the first state, a theoretical vale for the measured voltage in the first state is also 5 V, regardless of the resistance value of the first resistance. A theoretical value for the measured voltage in the second state is given by the above (Formula 4). Differential voltage ΔV, i.e., a difference between both measured voltages is 2.38 V. Because differential voltage ΔV is out of the given set range (of which the center value is 2.27 V), diagnosing unit 11*d* determines that leakage detecting device 10 is in the abnormal state As described above, according to the second modification, even if the second voltage output unit continuously outputs the same voltage in the first state and the second state, the same effect as that of the above exemplary embodiment is achieved by switching the output voltage from the first voltage output unit. In addition, according to the second modification, the theoretical value for the measured voltage in the second state is higher than that in the first modification. As a result, the measured waveform as a hole becomes more resistant to a drop in voltage level. The second voltage output unit may continuously output the second reference voltage, instead of continuously outputting the first reference voltage.

The present disclosure has been described above, based on the exemplary embodiment. The exemplary embodiment is merely an example of the exemplary embodiment, and it will be understood by those who are skilled in art that various modifications can be made by changing combinations of constituent elements and processes and that such modifications are also within the scope of the present disclosure.

The above exemplary embodiment has been described as an example in which the power supply voltage of 5 V is used as the first reference voltage and the ground voltage of 0 V is used as the second reference voltage. The first reference voltage and the second reference voltage are, however, not limited to 5 V and 0 V, respectively, and arbitrarily chosen two types of voltages may be used as the first reference voltage and the second reference voltage.

The above exemplary embodiment has been described as an example in which the rectangular wave voltage is applied from the first voltage output unit to coupling capacitor Cc via first resistance R1. In a different example, however, a sinusoidal voltage may be applied to coupling capacitor Cc. In this example, leakage determining unit 11*c* can specify a peak-to-peak value from the voltage waveform of a voltage at measurement point A and determine the presence or absence of a current leakage in the same manner as in the above exemplary embodiment.

The above exemplary embodiment has been described as an example in which leakage detecting device 10 incorporated in an electric vehicle is used. Leakage detecting device 10 according to the exemplary embodiment, however, may also be used in applications different from in-vehicle applications. In a configuration in which power storage unit 20 and a load supplied with power from power storage unit 20 are insulated from the ground, the load may be provided as any type of a load. For example, the load may be a load used in a railway vehicle.

The exemplary embodiment may be defined by the following items.

[Item 1]

Leakage detecting device (10) comprising: coupling capacitor (Cc) in a state of being insulated from a ground, coupling capacitor (Cc) having one end connected to a current path of power storage unit (20) connected to load (2); first voltage output unit (11*a*, OP1) that generates a cyclic voltage that changes cyclically, first voltage output unit (11*a*, OP1) applying the cyclic voltage to another end of coupling capacitor (Cc) via first resistance (R1); second voltage output unit (11*e*, OP3) that outputs a fixed voltage; second resistance (R2) and third resistance (R3) that are connected in series between a node and second voltage output unit (11*e*, OP3), the node being between coupling capacitor (Cc) and first resistance (R1); voltage measurement unit (11*b*) that measures a voltage at a voltage dividing point between second resistance (R2) and third resistance (R3); leakage determining unit (11*c*) that in a state of the cyclic voltage being outputted from first voltage output unit (11*a*, OP1), determines presence or absence of a leakage from a line between the current path of power storage unit (20) and the ground, based on a voltage measured by voltage measurement unit (11*b*); and diagnosing unit (11*d*) that in a period of two types of fixed voltages being applied to the voltage dividing point in order, determines whether leakage detecting device (10) is in a normal state, based on a voltage measured by voltage measurement unit (11*b*).

According to this configuration, a failure diagnosis of leakage detecting device (10) can be carried out highly precisely.

[Item 2]

Leakage detecting device (10) according to item 1, in which when a difference between a voltage measured in a first state in the period and a voltage measured in a second state in the period is out of a set range, diagnosing unit (11*d*) determines that leakage detecting device (10) is in an abnormal state, and the second state is different from the first state in at least either an output voltage from first voltage output unit (11*a*, OP1) or an output voltage from second voltage output unit (11*e*, OP3).

According to this configuration, a failure diagnosis of leakage detecting device (10) can be carried out highly precisely.

[Item 3]

Leakage detecting device (10) according to item 2, in which first voltage output unit (11*a*, OP1) outputs a first reference voltage in the first state and outputs a second reference voltage in the second state, while second voltage output unit (11*e*, OP3) outputs the second reference voltage in the first state and outputs first reference voltage in the second state.

According to this configuration, a preferable differential voltage for determination can be measured.

[Item 4]

Leakage detecting device (10) according to item 2, in which first voltage output unit (11*a*, OP1) continuously outputs a first reference voltage or a second reference voltage in the first state and the second state, while second voltage output unit (11*e*, OP3) outputs the first reference voltage in the first state and outputs the second reference voltage in the second state.

According to this configuration, a preferable differential voltage for determination can be measured.

[Item 5]

Leakage detecting device (10) according to item 2, in which first voltage output unit (11*a*, OP1) outputs a first reference voltage in the first state and outputs a second reference voltage in the second state, while second voltage output unit (11*e*, OP3) continuously outputs the first reference voltage or the second reference voltage in the first state and the second state.

According to this configuration, a preferable differential voltage for determination can be measured.

[Item 6]

Leakage detecting device (10) according to any one of item 3 to item 5, in which the first reference voltage is a high-side reference voltage, and the second reference voltage is a low-side reference voltage.

According to this configuration, the first reference voltage and the second reference voltage can be generated easily.

[Item 7]

Vehicular power supply system (5) comprising: power storage unit (20) that is incorporated in a vehicle, power storage unit (20) being kept insulated from a chassis ground of the vehicle, and that supplies power to load (2) in the vehicle; and leakage detecting device (10) described in any one of item 1 to item 6.

According to this configuration, vehicular power supply system (5) including leakage detecting device (10) capable of carrying out a failure diagnosis of itself with high accuracy is provided.

REFERENCE MARKS IN THE DRAWINGS

2: inverter
3: motor
Lp: positive line
Lm: negative line
Cp: positive-side Y capacitor
Cm: negative-side Y capacitor
Rlp: positive-side leakage resistance
Rlm: negative-side leakage resistance
Rlb: leakage resistance
MRp: positive-side main relay
MRm: negative-side main relay
5: power supply system
20: power storage unit
E1-En: cell
10: leakage detecting device
11: controller
11*a*: oscillator
11*b*: voltage measurement unit
11*c*: leakage determining unit
11*d*: diagnosing unit
11*e*: constant voltage output unit
Cc: coupling capacitor
R1: first resistance
R2: second resistance
R3: third resistance
C1: smoothing capacitor
OP1: first operational amplifier
OP2: second operational amplifier
OP3: third operational amplifier

The invention claimed is:

1. A leakage detecting device comprising:
a coupling capacitor, the coupling capacitor including one end connected to a current path of a power storage unit connected to a load, the power storage unit being in a state of being insulated from a ground;
a first voltage output unit that generates a cyclic voltage in a leakage determination state, the first voltage output unit applying the cyclic voltage to another end of the coupling capacitor via a first resistance;
a second voltage output unit;
a second resistance and a third resistance that are connected in series between a node and the second voltage output unit, the node being between the coupling capacitor and the first resistance;
a voltage measurement unit that measures a voltage at a voltage dividing point between the second resistance and the third resistance;
a leakage determining unit that in the leakage determination state of the cyclic voltage being outputted from the first voltage output unit, determines whether or not a current leakage occurs between the current path of the power storage unit and the ground, based on a voltage measured by the voltage measurement unit; and
a diagnosing unit that in a diagnostic period of two types of fixed voltages being applied to the voltage dividing point in order, determines whether the leakage detecting device is in a normal state, based on a voltage measured by the voltage measurement unit, the diagnostic period distinct from the leakage determination state,
wherein the first voltage output unit is configured to output one or more reference voltages during the diagnostic period, and
the second voltage output unit is configured to output one or more reference voltages during the diagnostic period,
wherein the voltage measurement unit is connected to the voltage dividing point without the second resistance nor the third resistance interposed between the voltage dividing point and the voltage measurement unit.

2. The leakage detecting device according to claim 1, wherein
when a difference between a voltage measured in a first state in the diagnostic period and a voltage measured in a second state in the diagnostic period is out of a set range, the diagnosing unit determines that the leakage detecting device is in an abnormal state, and
the second state is different from the first state in at least either an output voltage from the first voltage output unit or an output voltage from the second voltage output unit.

3. The leakage detecting device according to claim 2, wherein
the first voltage output unit outputs a first reference voltage in the first state and outputs a second reference voltage, different from the first reference voltage, in the second state, and
the second voltage output unit outputs the second reference voltage in the first state and outputs the first reference voltage in the second state.

4. The leakage detecting device according to claim 3, wherein
the first reference voltage is a high-side reference voltage, and
the second reference voltage is a low-side reference voltage.

5. The leakage detecting device according to claim 2, wherein
the first voltage output unit continuously outputs either a first reference voltage or a second reference voltage, different from the first reference voltage, in both of the first state and the second state, and the second voltage output unit outputs the first reference voltage in the first state and outputs the second reference voltage in the second state.

6. The leakage detecting device according to claim 2, wherein the first voltage output unit outputs a first reference voltage in the first state and outputs a second reference voltage, different from the first reference voltage, in the second state, and the second voltage output unit continuously outputs either the first reference voltage or the second reference voltage in both of the first state and the second state.

7. A vehicular power supply system comprising:

a power storage unit that is kept insulated from a chassis ground of the vehicle and supplying power to a load in the vehicle; and the leakage detecting device according to claim 1.

* * * * *